(12) United States Patent
Winkeler et al.

(10) Patent No.: US 8,105,868 B2
(45) Date of Patent: Jan. 31, 2012

(54) METHOD FOR MAKING SOLAR SUB-CELLS FROM A SOLAR CELL

(75) Inventors: Jan Winkeler, Zevenaar (NL); Gerrit C. Dubbeldam, Zevenaar (NL); Peter E. Sportel, Arnhem (NL)

(73) Assignee: Helianthos B.V., Arnhem (NL)

( * ) Notice: Subject to any disclaimer, the term of this patent is extended or adjusted under 35 U.S.C. 154(b) by 33 days.

(21) Appl. No.: 12/312,672

(22) PCT Filed: Dec. 21, 2007

(86) PCT No.: PCT/EP2007/064416
§ 371 (c)(1), (2), (4) Date: Oct. 7, 2009

(87) PCT Pub. No.: WO2008/074879
PCT Pub. Date: Jun. 26, 2008

(65) Prior Publication Data
US 2010/0087026 A1    Apr. 8, 2010

(30) Foreign Application Priority Data

Dec. 21, 2006 (EP) .................................. 06126871

(51) Int. Cl.
*H01L 21/00* (2006.01)
(52) U.S. Cl. .................. 438/98; 438/61; 257/E21.447; 257/E21.438; 136/258
(58) Field of Classification Search ............ 438/61, 438/96, 98, 940; 257/457, E21.477, E21.483, 257/E31.002, E31.003, E21.126, E21.124, 257/E31.11; 136/255, 258
See application file for complete search history.

(56) References Cited

U.S. PATENT DOCUMENTS

| | | | |
|---|---|---|---|
| 4,745,078 A * | 5/1988 | Stetter et al. | 438/74 |
| 4,929,281 A * | 5/1990 | Worner | 438/80 |
| 4,948,740 A * | 8/1990 | Plaettner | 438/65 |
| 2003/0041893 A1 | 3/2003 | Shimakawa et al. | |

FOREIGN PATENT DOCUMENTS

CN        1407634 A        4/2003
(Continued)

OTHER PUBLICATIONS

Pernet, et al. "Front Contact and Series Connection Problems of a-Si:H Solar Cells on Polymer Film Substrates", Proc 2nd World Conf. PV (Jul. 1998) 4 pages.*

(Continued)

*Primary Examiner* — Caridad Everhart
(74) *Attorney, Agent, or Firm* — Oliff & Berridge, PLC

(57) ABSTRACT

The invention pertains to a method for making a solar cell module comprising solar cells connected in series, comprising the steps of: a) making in a system composed of a substrate-overlaid by a first electrode layer, itself overlaid by an active layer, a first, interruption, groove providing an interrupt in the front electrode and the active layer and a second, interconnection, groove through the active layer, the first and second grooves being positioned close to each other; b) inserting an insulating compound into the interruption groove; c) applying a lift-off compound onto the active layer at a position adjacent to the interconnection groove on the other side of the interconnection groove than the insulation groove; d) applying the second electrode; e) removing the lift-off compound and the overlaying second electrode at that position to obtain a groove in the second electrode.

11 Claims, 1 Drawing Sheet

FOREIGN PATENT DOCUMENTS

Figure 1:
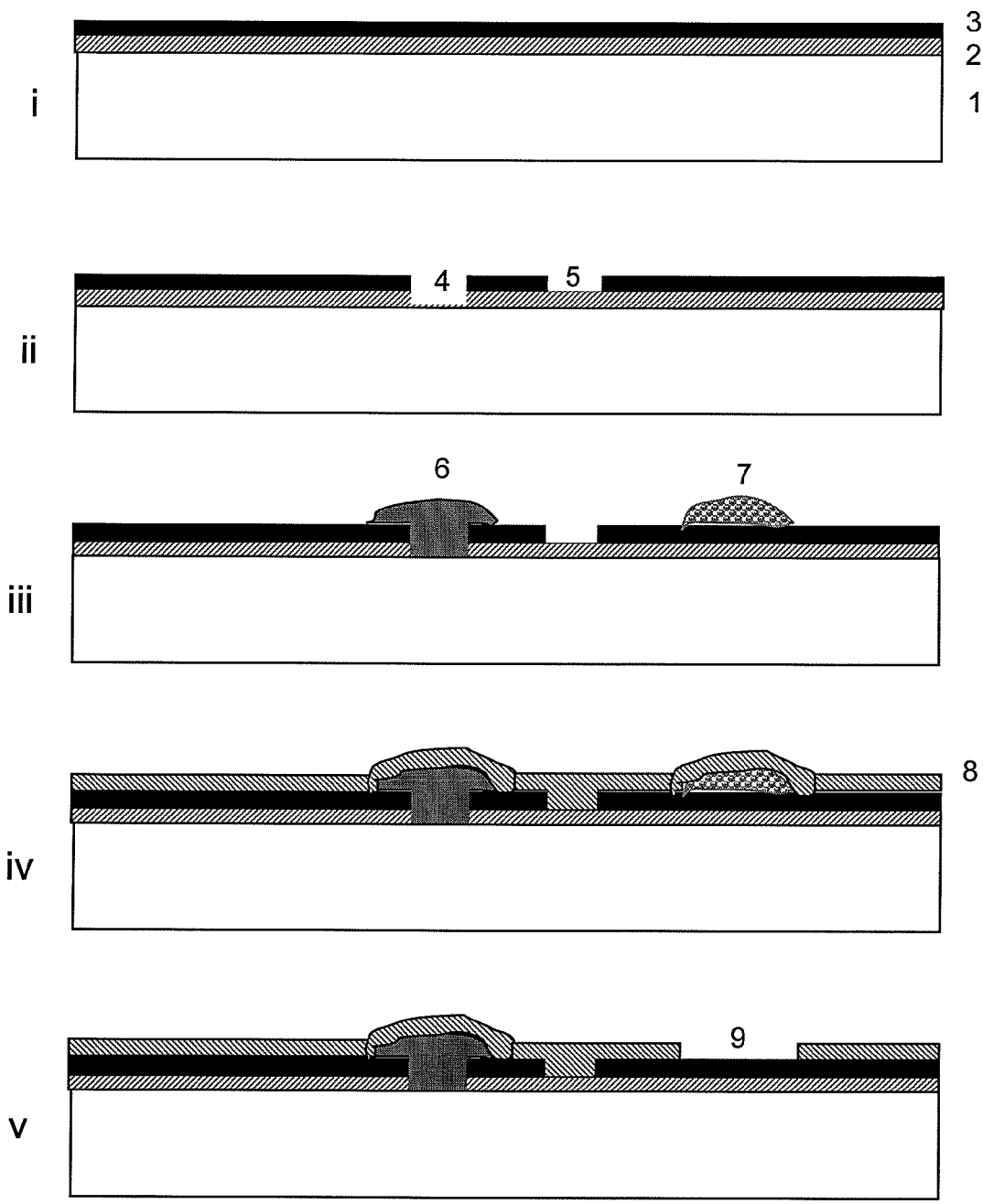

| | | |
|---|---|---|
| CN | 1826693 A | 8/2006 |
| EP | 1 291 920 A2 | 3/2003 |
| JP | S62-190882 | 8/1987 |
| JP | A-2003-249673 | 9/2003 |
| JP | A-2006-528420 | 12/2006 |
| WO | WO 98/13882 | 4/1998 |
| WO | WO 99/49483 | 9/1999 |
| WO | WO2005/015638 * | 2/2005 |
| WO | WO 2005/015638 A1 | 2/2005 |

OTHER PUBLICATIONS

Chinese Office Action issued in Chinese Patent Application No. 2007800469347 on Jun. 11, 2010 (with translation).

English-language translation of Japanese Office Action issued in Japanese Patent Application No. 2009-542085 on Feb. 12, 2010.

Pernet et al.; "Front Contact and Series Connection Problems of a-Si:H Solar Cells on Polymer Film Substrates;" *Proc. 2nd World Conference PV*; Jul. 1998.

* cited by examiner

METHOD FOR MAKING SOLAR SUB-CELLS FROM A SOLAR CELL

The invention pertains to a method for making solar sub-cells from a solar cell.

With the manufacturing of (thin film) solar modules it is essential to divide the cell into a number of sub-cells and to connect the sub-cells in series thus forming a module. The current path and the current density are limited so that losses due to electrical resistances are decreased. The module voltage is increased so that it fits better with possible applications. In the case of thin film technology the module consists mostly of a number of ribbon shaped cells. The cells are monolithically connected to each other. Between two adjacent cells the front electrode and the back electrode are interrupted. Between the two interrupts the front- and the back-electrode are electrically connected.

The principal layers of a thin film solar cell are the transparent conductive oxide layer (front electrode, at the side of the solar cell which receives incident light), the active layer (e.g. silicon) and the metal layer (back electrode, at the other side of the solar cell). Also the substrate that carries the cell may be important.

For obtaining series connected thin film solar cells normally the following process steps are needed:
  The transparent conductive oxide (TCO) layer that is deposited onto the (glass) substrate is patterned with parallel grooves. The grooves form the interrupts in the front electrode.
  The active (e.g. silicon) layer that is deposited over the TCO layer is also patterned with parallel grooves. The grooves form the connections between the front- and the future back-electrode.
  The back electrode that is deposited over the active layer is patterned with grooves that form the interrupts.

For avoiding excessive dead zones the patterns in the three layers must be as close together as possible and the grooves in the various layers must be as narrow as possible. Very accurate repositioning is essential.

This known process is time consuming since it involves three separate process steps, and complex because of the accuracy demands. Particularly, with thin film solar cells on flexible substrates, the change of the lateral dimensions due to the deposition of the layers is an extra complication with a multi-step patterning process.

Therefore there is a demand for a simple method for making solar cell modules, which can be performed in a single continuously performed process.

A one-step process has been proposed by P. Pernet et al., Proc. $2^{nd}$ World Conference P V, Wien, July 1998. According to that process after depositing all needed layers at the substrate (metal back-electrode, NIP layer and ITO or ZnO front electrode) three grooves of different depths were made by selective laser scribing in one process step, after which the deepest groove down to the substrate was filled with an insulating compound, and the second deep groove down to the metal back electrode was filled with a conducting paste that overlaps the insulating paste in the deepest groove to form an electrical connection between the back electrode and the front electrode. The shallowest groove down to the active NIP layer is the interruption in the front electrode. This method appeared to be unpractical for commercial production since the laser scribing step cannot be performed in such manner that shunting in the open grooves is always prevented.

WO 2005/015638 describes a method for providing a series connection in a solar cell foil based on a temporary substrate wherein part of the substrate is retained on the solar cell foil at the location of the interconnect, so as to obtain a cap of a protective material on the interconnect.

It is an object of the invention to provide a one-step method that can be commercially applied in a reliable manner.

To this end a process that permits all needed patterning in one process step has been developed. Since no repositioning is needed the process is fast and relatively simple to be carried out. The patterning takes place when one of the electrodes and the active layer have been deposited onto the substrate.

The invention pertains to a method for making a solar cell module comprising solar cells connected in series, comprising a first electrode, an active layer, and a second electrode, wherein at least one of the first and second electrodes is a transparent conductive oxide layer, comprising the steps of:
a) making in a system composed of at least a substrate overlaid by a first electrode layer, which first electrode layer is overlaid by an active layer, at least one pair of a first, interruption, groove providing an interrupt in the front electrode and the active layer and a second, interconnection, groove through the active layer, the first and second grooves being positioned close to each other;
b) inserting an insulating compound into the interruption groove;
c) applying prior to step b), simultaneously with step b), or after step b) a lift-off compound onto the active layer at a position adjacent to the interconnection groove on the other side of the interconnection groove than the insulation groove;
d) applying the second electrode over the active layer, the insulating compound and the lift-off compound; and
e) removing the lift-off compound and the overlaying second electrode at that position to obtain a groove in the second electrode.

In step a) of the process according to the invention a first, interruption, groove is provided which provides an interrupt in the front electrode. In a first embodiment of this groove, applicable both when the first electrode is a transparent conductive oxide layer and when the first electrode is a metal back electrode, the interrupt is provided by making a groove through the active layer and the first electrode layer. In another embodiment of the present invention, applicable only when the first electrode is a transparent conductive oxide layer, the interrupt is provided by making a groove through the active layer in such a manner that the transparent conductive oxide layer is vitrified at the location of the insulating groove to form an insulating section, the interrupt, in the electrode layer. In this latter embodiment use is made of the fact that some materials used as electrode materials show vitrification when subjected to sufficient energy. The vitrified material is not conductive, but insulating. When a material of this type is used as electrode, the insulation between two solar cells can be obtained by providing the first, insulating, groove through the active layer while providing sufficient energy so that the electrode layer is vitrified at the location of the insulating groove. In one embodiment a laser with an appropriate wavelength is used to combine the provision of a groove in the active layer with vitrification of the underlying transparent conductive oxide layer. Selection of an appropriate vitrification method is within the scope of a skilled person. Suitable electrode materials for this embodiment include indium tin oxide, zinc oxide, zinc oxide doped with aluminum, fluorine, gallium, or boron, cadmium oxide, tin oxide, metal stannates, such as Zn or Cd stannates, and F-doped $SnO_2$, Sb-doped $SnO_2$, p-doped TCO, such as cuprates, for example Sr-based cuprates.

As indicated above, at least one of the first electrode and the second electrode is a transparent conductive oxide layer. If both the first electrode and the second electrode are transparent conductive oxide layers, a semi-transparent solar cell system is obtained. However, it is preferred for one of the first electrode and the second electrode to be a transparent conductive oxide layer, while the other of the first electrode and the second electrode is a back electrode, that is, a non-transparent metal layer. Because the back electrode helps to reflect light back into the solar cell, cells of this configuration generally show a higher efficiency.

In one embodiment of the present invention, the first electrode is a transparent conductive oxide layer deposited on a permanent substrate, e.g., a glass substrate or a temperature resistant transparent polymer substrate. Within the context of the present specification a permanent substrate is a substrate which will not be removed before the solar cell is ready for use. In another embodiment, the first electrode is a transparent conductive oxide layer deposited on a temporary substrate. Within the context of the present specification a temporary substrate is a substrate which will be removed from the TCO before the solar cell is suitable for use. Processes wherein use is made of a temporary substrate are known in the art and described in, for example, WO 98/13882 or WO99/49483. In a further embodiment, the first electrode is a back electrode, deposited on a permanent or temporary substrate.

In general, it is preferred for the substrate used in the process according to the invention, whether it is a temporary or a permanent substrate, to be in the form of a foil, so that the process can be carried out as a roll-to-roll process.

The embodiment wherein the first electrode is a transparent conductive oxide layer which is deposited on a temporary substrate which is a metal foil is an attractive embodiment of the present invention.

The embodiment wherein the first electrode is a transparent conductive oxide layer which is deposited on a permanent glass or polymer substrate is also an attractive embodiment of the present invention.

The embodiment wherein the first electrode is a back electrode layer which is deposited on a permanent glass or polymer substrate is also an attractive embodiment of the present invention.

As indicated above, in between two future adjacent cells two grooves are applied close together, a first groove providing an interrupt in the first electrode and a second groove through the active layer only. The second groove serves for the future connection between the front and the back electrode. The grooves are positioned close together for minimizing the dead zone.

Next, the first, insulation, groove is filled with an insulating compound, such as an inert and insulating paste which avoids short circuit at that position. Typical insulating compounds are organic single- or multicomponent insulating compositions that are known in the art, e.g. epoxy resins on the basis of bisphenol A or F, or of other polyols such as aliphatic glycols, novolacs and epoxides with cycloaliphatic backbone and reactive diluents like butyl glycidyl ether, cresyl glycidyl ether, 2-ethylhexyl glycidyl ether, and the like. These resins can be converted into thermoset compounds with the desired mechanical and electrical insulating properties by curing (or polyaddition) with common curing agents like polybasic acids and acid anhydrides, mono and polyamines, amino resins, polyamides, polyurea, polythiols, polymercaptanes, Lewis acids, and the like, at suitable curing conditions for to the type of crosslinking reaction (heat, UV-photoinitiated curing, etc.). With regard to the process rate crosslinking by means of UV curing is preferred. Suitable acids anhydrides are phthalic anhydride, (methyl)tetrahydrophthalic anhydride, trimellitic anhydride, (methyl)hexahydrophthalic anhydride, nadic methyl anhydride, dodecyl succinic anhydride, and the like. Examples of polyamides are Versamid® from Cognis and Ancamide® from Air Products. Suitable amines are diethylamino propylamine, diethylene triamine, diethyltoluene diamine, triethylene tetramine, tetraethylene pentamine, polyethylene polyamine, 1,2-cyclohexanediamine, aminoethyl piperazine, metaphenylene diamine, dicyandiamide, diaminodiphenyl sulfone. The curing reaction can be catalyzed by incorporation of alcohols, phenols, acids, tertiary amines, and sulfur containing compounds. Suitable thiols are aliphatic and aromatic (poly)thiols like 1,2-ethanedithiol, 1,3-propanedithiol, 1,4-butanedithiol, pentaerythritol tetramercaptoacetate, 1,2-ethanediol bismercaptoacetic acid, 1,4-benzenedimethanol dimercaptoacetic acid, 1,3-benzenedimethanol dimercaptoacetic acid, 1,2-benzenedimethanol dimercaptoacetic acid, 1,4-benzenedimethanethiol, 1,3-benzenedimethanethiol, 1,2-benzenedimethanethiol, and the like. Another class of resins comprises (poly)hydroxy-functional resins like hydroxy-terminated polyesters, polyether diols, polyols, e.g. Desmophen®, that are cross-linked with polyisocyanates or polyisocyanurates, e.g. Desmodur®. In both cases solvents optionally used to apply the insulating compound into the grooves should be evaporated prior to curing. Other insulating compounds, e.g. mixtures of acrylated monomers and acrylated (pre)polymers or acrylate- or maleimide (co)polymers, can be used too. These compounds are preferably crosslinked either by heat or UV in the case that a subsequent lamination of the PV foil at elevated temperature is performed, since thermoplastics (non crosslinked polymers) are prone to bleeding under lamination conditions. Proper selection of the insulating compound is necessary in view of the required adhesion to the walls of the grooves in order to withstand the mechanical loading of the series connected PV-film.

Finally a second compound is applied next to the second, connection, groove opposite the first, insulation, groove. That paste serves as lift-off compound which prepares the formation of the interrupts in the second electrode. Typical lift-off compounds are cellulose derivatives such as hydroxyethyl cellulose, hydroxypropyl cellulose, polyethylene glycol, polypropylene glycol, polyethylene oxides, polypropylene oxides, polyvinyl alcohol, and mixtures thereof. Mixtures of two or more of these polymers may be used, e.g. a mixture of polyethylene glycol and polypropylene glycol. These polymers are commonly mixed with filler particles such as, for instance, talc, salt like barium sulfate, silica, clay (such as montmorrillonite), and the like. Preferred silica materials are silicas like Kromasil® from Akzo Nobel. The filler particle may also be an expandable particle, for instance a heat-expandable particle of the type Expancel®. Water-soluble particles may be used provided that the solvent is not water.

Preferably the lift-off compound and the insulating compound are applied at the same time, to allow simultaneous application of both compounds in the process.

It is also possible to start with the deposition of the lift-off compound lines before making the grooves. All needed patterns have been made at this stage.

Then, the second electrode is deposited. By means of a bulk process the second electrode is simply removed at the position of the lift-off paste lines without repositioning. After developing the lift-off lines the series connection between the parts of the solar cell opposite the pattern is realized.

The invention is illustrated by FIG. 1. FIG. 1 shows the process steps of the invention. This invention should not be construed as limited to or by what is depicted in said FIGURE.

i) Represents a solar cell comprising a substrate 1, an electrode layer 2 and an active layer 3. The substrate can be any material to be provided with a patterned layer. Thus, the substrate can be made up of a single sheet of, e.g., glass, polymer, or metal, but it can also be made up of a multilayer structure. The substrate may be a temporary substrate or a permanent substrate.

ii) Into the active layer and electrode layer a pair of grooves 4,5 is made. The first groove is made through both the electrode layer and the active layer and the second groove is made through the active layer only. The grooves can be made in several manners such as by scratching, by chemical etching or by laser etching. The latter method is preferred. As indicated above, in the case where the first electrode is a transparent conductive oxide layer it is also possible to provide the interrupt in the transparent conductive oxide layer by providing the groove through the active layer while ensuring vitrification of the transparent conductive oxide layer.

The width of the two grooves is generally <0.25 mm, preferably <0.1 mm, more preferably <0.5 mm. The grooves generally have a minimum width of 2 microns. The distance between the first and second groove of the pair of grooves is generally <1 mm, preferably <0.5 mm, more preferably <0.25 mm. The minimum distance is generally at least 5 microns.

iii) The first groove is filled with an insulating compound 6, and a lift-off compound 7 is provided onto the active layer at a position where it is intended to provide an interrupt in the second electrode. Suitable compounds are pastes as indicated above, which can be applied in several manners known in the art such as with screen printing, using ink-jets, or using dispensers.

In one embodiment, a lift-off compound is used which is a dispersion of a filler particle having an average particle size greater than 2 microns in a solution of a polymer and a solvent. The back electrode material is applied in a layer having a thickness less than 2 micron onto the material provided with the lift-off compound.

In this embodiment a dispersion of filler particles in a polymer solution is used. Use of such dispersion advantageously ensures a certain roughness at the positions where the dispersion is applied onto the substrate, so that the subsequently applied back electrode layer will not deposit homogeneously over these positions of the substrate. In turn, the layer that is non-homogeneously deposited at the pattern allows easy removal of the polymer, thereby providing the desired grooves in the layer. In view of unwanted pattern line-broadening, the polymer that is used in the lift-off compound of this embodiment should preferably display a high viscosity at a relatively low concentration of the polymer in the solvent to solubilize the polymer. The skilled person will appreciate that the ratio of the amount of polymer in the solution and the amount of dispersed filler particles has to be optimized to obtain suitable coherence of the pattern lines and adhesion of the pattern, which has usually the form of lines, to the underlying photovoltaic layer and also to obtain easy removal of the pattern afterwards. Suitable polymers are cellulose derivatives such as hydroxyethyl cellulose, hydroxypropyl cellulose, polyethylene glycol, polypropylene glycol, polyethylene oxides, polypropylene oxides, polyvinyl alcohol, and mixtures thereof. Mixtures of two or more of these polymers may be used, e.g. a mixture of polyethylene glycol and polypropylene glycol. The solvent that is used may be any solvent that is suitable for solubilizing the polymer. Preferably, the solvent is water, an alcohol (e.g. methanol, ethanol, propanol), or a mixture thereof.

The filler particles that are used for providing the dispersion in this embodiment have an average particle size of more than 2 microns and should preferably be inert particles having an average particle size of 2-20 microns, more preferably an average particle size of 5-15 microns. Too coarse particles may give rise to a lower pattern resolution and/or wider pattern lines. For instance, the filler particle may be talc, salt like barium sulfate, silica, clay (such as montmorrillonite), and the like. Preferred silica materials are silicas like Kromasil® from Akzo Nobel. The filler particle may also be an expandable particle, for instance a heat-expandable particle of the type Expancel®. Water-soluble particles may be used provided that the solvent is not water. The dispersion of filler particles in polymer solution preferably contains at least 10 wt. % of filler particles, preferably from 10-50 wt. %.

The concentration of the polymer in the solution and the amount of dispersed filler particles have to be optimized to obtain suitable coherence of the pattern and adhesion of the pattern to the substrate and at the same time should give a pattern that can easily be removed afterwards. This optimisation is well within the scope of the skilled person. As an example, when 100 grams of 7 wt. % hydroxypropyl cellulose in a mixture of ethanol and water is provided with 10 grams of filler particles, e.g. Kromasil®, the polymer to filler ratio is 7 to 10.

The dispersion is applied onto the photovoltaic layer in a desired pattern, for instance by means of a dispenser. After evaporation of the solvent of the applied dispersion, a dry and rough pattern, usually in the form of lines, is left. The degree of roughness of the pattern lines can be influenced by the amount of filler particles in the dispersion, by the average particle size, and by the particle size distribution.

In this embodiment the back electrode layer is applied in a thickness of less than 2 microns, preferably a thickness of 0.01 to 2 microns, more preferably 0.04 to 1 microns.

The grooves and the paste lines can be applied in one movement. To that end the tools are fixed in one block and they are accurately positioned with respect to each other. The application speed of the grooves and the paste lines must be equal in that case. A number of such blocks can be mounted next to each other so that many groove—and line pairs can be made in one movement. Such a configuration is particularly suited in a roll to roll process.

The insulating paste line is applied on the deep groove 4. The width at the part extending from the groove is not critical, and may for example be between 0.1 mm and 0.3 mm. The height after curing is not critical and may for example be <0.05 mm, preferably <0.02 mm, more preferably <0.01 mm.

The distance between the connection groove and the center of the lift-off line is not critical and generally <0.5 mm, preferably <0.25 mm, which corresponds to the distance between the center of the first groove and the center of the lift-off compound being not critical and generally <1.6 mm, preferably <0.6 mm. The width of the lift-off line is generally between 0.05 and 0.5 mm, in particular between 0.05 and 0.25 mm, more in particular between 0.05 and 0.15 mm.

iv) The second electrode 8 is deposited.

v) By means of a bulk process the second electrode is simply removed at the position of the lift-off paste lines without repositioning. After developing the lift-off lines the series connection between the parts of the solar cell opposite the pattern is realized. The removal of the lift-off compound can be performed by contacting the system with a suitable solvent for an adequate period of time to obtain swelling and/or dissolution of the lift-off compound, which usually is a polymer, at the positions where the dispersion is applied, and removing the compound, optionally with no longer (fully) cohering filler particles. When the layer at the patterned positions is not fully removed during the above process, the remainders can be removed in a subsequent step such as further dissolution or mechanical force, for instance by washing, wiping and/or (gently) brushing. In the embodiment where a filler-containing dispersion is used, the non-homogeneous deposition of layer at the sites where polymer and filler particles are present results in easy removal of the layer.

The contacting with solvent may be done at any temperature below the boiling point of the solvent, but conveniently may be done at an ambient temperature, e.g. 15° C. to 50° C.

Typically, the solvent used for extraction may be e.g. water, alcohol, such as methanol, ethanol, or propanol, or mixtures thereof. If the lift-off compound comprises a solvent, the solvent used for extraction may be the same solvent as used for making the polymer dispersion Suitable transparent conductive oxides for use in the present invention have been mentioned above.

The active layer is a photovoltaic layer which may comprise any suitable system known to the skilled person, e.g., amorphous silicon (a-Si:H), microcrystalline silicon, polycrystalline silicon, monocrystalline silicon, amorphous silicon carbide (a-SiC) and a-SiC:H, amorphous silicon-germanium (a-SiGe) and a-SiGe:H, a-SiSn:H. Also, use may be made of CIS (copper indium diselenide: CuInSe2), cadmium telluride, Cu(In,Ga)Se, Cu(In,Ga, or other)S, ZnSe/CIS, ZnO/CIS, and Mo/CIS/CdS/ZnO. The use of thin-film solar cells of amorphous or microcrystalline silicon is preferred.

The back electrode in the thin film solar cell sheet according to the invention preferably serves both as reflector and as electrode. Generally, the back electrode will have a thickness of about 50 to 500 nm, and it may comprise any suitable conductive material having light reflecting properties, preferably a metal, in particular aluminum, silver, or a combination of layers of both, and making good ohmic contact with the semiconductor layer. Preferably, it is possible to apply the metal layers at a comparatively low temperature, say less than 250° C., by means of, e.g., electrodeposition, (in vacuo) physical vapor deposition or sputtering. In the case of silver, it is preferred to first apply an adhesion promoter layer. $TiO_2$, TiN, ZnO, and chromium oxide are examples of suitable materials for an adhesion promoter layer and have the advantage of also possessing reflecting properties when applied in a suitable thickness, e.g., of 20-200 nm, in particular 50-100 nm.

The manner in which the layers are to be applied is known to the person skilled in the art and requires no further elucidation here. The only issue worth noting is that care should be taken that the second electrode is applied under such conditions that the lift-off compound is not damaged or removed during the application of the second electrode. Obviously, care should be taken for all layers that the deposition conditions are selected such that the layers onto which the deposition takes place are not affected by the deposition conditions.

If so desired, the solar cell may comprise additional known components such as encapsulants or protective layers to protect the unit against environmental effects.

The invention claimed is:

1. A method for making a solar cell module comprising solar cells connected in series, the module comprising a first electrode layer, an active layer, and a second electrode layer, wherein at least one of the first and second electrode layers comprises a transparent conductive oxide layer, the method comprising the steps of:
   a) making, in a system comprising at least a substrate overlaid by a first electrode layer, which first electrode layer is overlaid by an active layer, at least one pair of an interrupt in the first electrode layer and the active layer and an interconnection groove through the active layer;
   b) providing an insulating compound filling the interrupt;
   c) applying a lift-off compound onto the active layer at a position adjacent to the interconnection groove on an other side of the interconnection groove from the interrupt;
   d) applying the second electrode layer over the active layer, the insulating compound and the lift-off compound; and
   e) removing the lift-off compound and a portion of the second electrode at the position adjacent to the interconnection groove to obtain a groove in the second electrode layer;
   wherein the interrupt, the interconnection groove, the insulating compound and the lift-off compound are simultaneously applied at fixed relative distances.

2. The method according to claim 1 wherein a multitude of pairs of interrupts and interconnection grooves are made to obtain a pattern for one or more series connections of the solar cells.

3. The method according to claim 1 wherein the steps are performed with a roll to roll process.

4. The method according to claim 1 wherein the interrupts and interconnection grooves are made by laser-scribing.

5. The method according to claim 1 wherein the first electrode layer comprises a transparent conductive oxide and the interrupt in the transparent conductive oxide layer is obtained through vitrification of the transparent conductive oxide.

6. The method according to claim 1 wherein the lift-off compound comprises a dispersion of filler particles having an average particle size of greater than 2 microns in a solution of a polymer and a solvent.

7. The method according to claim 1 wherein the first electrode layer is a back electrode and the second electrode layer is a transparent conductive oxide layer.

8. The method according to claim 1 wherein the interrupt is an interrupt groove, and wherein in step b) the insulating compound is inserted into the interrupt groove forming the interrupt.

9. The method according to claim 1 wherein tools for applying the interrupt, the interconnection groove, the insulating compound and the lift-off compound are fixed in a single block.

10. The method according to claim 1 wherein the first electrode layer is a transparent conductive oxide layer and the second electrode layer is a back electrode.

11. The method according to claim 10 wherein the transparent conductive oxide layer is deposited on a transparent permanent substrate or on a temporary substrate.

* * * * *